(12) United States Patent
Chung et al.

(10) Patent No.: US 11,739,262 B2
(45) Date of Patent: Aug. 29, 2023

(54) LIGHT-EMITTING DEVICE AND METHOD OF MANUFACTURING THE SAME

(71) Applicant: Samsung Electronics Co., Ltd., Suwon-si (KR)

(72) Inventors: Jongwon Chung, Hwaseong-si (KR); Hyungjun Kim, Suwon-si (KR); Byunghwa Seo, Seongnam-si (KR); YongChul Kim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 437 days.

(21) Appl. No.: 17/108,310

(22) Filed: Dec. 1, 2020

(65) Prior Publication Data

US 2021/0292645 A1    Sep. 23, 2021

(30) Foreign Application Priority Data

Mar. 19, 2020  (KR) .................. 10-2020-0034049

(51) Int. Cl.
*H01L 51/50* (2006.01)
*C09K 11/66* (2006.01)
*H10K 85/10* (2023.01)
*H10K 85/60* (2023.01)
*H10K 50/15* (2023.01)
*H10K 50/16* (2023.01)

(52) U.S. Cl.
CPC .......... *C09K 11/665* (2013.01); *H10K 85/151* (2023.02); *H10K 85/633* (2023.02); *H10K 85/654* (2023.02); *H10K 85/655* (2023.02); *H10K 50/15* (2023.02); *H10K 50/16* (2023.02)

(58) Field of Classification Search
CPC ... C09K 11/665; H10K 85/151; H10K 85/633
See application file for complete search history.

(56) References Cited

U.S. PATENT DOCUMENTS

| 10,224,459 B2 | 3/2019 | Gao et al. |
| 10,636,993 B2 | 4/2020 | Friend et al. |
| 2017/0338427 A1 | 11/2017 | Otsuki et al. |

(Continued)

FOREIGN PATENT DOCUMENTS

| JP | 2018504787 A | 2/2018 |
| KR | 100870542 B1 | 11/2008 |
| KR | 101703451 B1 | 2/2017 |

(Continued)

OTHER PUBLICATIONS

Kihyung Sim et al., "Performance boosting strategy for perovskite light-emitting diodes," Applied Physics Reviews, Jul. 30, 2019, pp. 1-10, vol. 6, Issue 031402.

(Continued)

*Primary Examiner* — Anthony Ho
(74) *Attorney, Agent, or Firm* — CANTOR COLBURN LLP

(57) ABSTRACT

A light-emitting device includes: a first electrode; a second electrode facing the first electrode; and an activation layer located between the first electrode and the second electrode and includes an emission layer and an auxiliary layer, wherein the auxiliary layer is located between the first electrode and the emission layer and includes a block copolymer, the block copolymer includes at least one hydrophilic block and at least one hydrophobic block, and the emission layer includes a perovskite structure.

20 Claims, 8 Drawing Sheets

(56) References Cited

U.S. PATENT DOCUMENTS

2019/0036030 A1  1/2019  Wang et al.
2019/0256535 A1  8/2019  Ma et al.

FOREIGN PATENT DOCUMENTS

| KR | 20170093807 A | 8/2017 |
| KR | 101945128 B1 | 2/2019 |
| WO | 2019099647 A1 | 5/2019 |

OTHER PUBLICATIONS

Loredana Protesescu et al., "Nanocrystals of Cesium Lead Halide Perovskites (CsPbX3, X=Cl, Br, and I): Novel Optoelectronic Materials Showing Bright Emission with Wide Color Gamut," Nano Letters, Jan. 29, 2015, pp. 3692-3696, vol. 15.

Quyet Van Le et al., "Recent Advances toward High-Efficiency Halide Perovskite Light-Emitting Diodes: Review and Perspective," Small Methods, 2018, pp. 1-18, vol. 1700419.

LIGHT-EMITTING DEVICE AND METHOD OF MANUFACTURING THE SAME

CROSS-REFERENCE TO RELATED APPLICATION

This application claims priority to and the benefit of Korean Patent Application No. 10-2020-0034049, filed on Mar. 19, 2020, in the Korean Intellectual Property Office, the disclosure of which is incorporated herein in its entirety by reference.

BACKGROUND

1. Field

One or more embodiments relate to a light-emitting device including a perovskite structure and a method of manufacturing the same.

2. Description of Related Art

Light-emitting devices are devices that convert electrical energy into light energy.

A commercially available light-emitting device includes an anode, a cathode, and an emission layer that is between the anode and the cathode. Additionally, a hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state to thereby generate light.

SUMMARY

Provided is an improved light-emitting device including a perovskite structure and a method of manufacturing the same.

Additional aspects will be set forth in part in the description which follows and, in part, will be apparent from the description, or may be learned by practice of the presented embodiments of the disclosure.

According to an embodiment, a light-emitting device includes a first electrode, a second electrode facing the first electrode, and an activation layer located between the first electrode and the second electrode and including an emission layer and an auxiliary layer, wherein the auxiliary layer is located between the first electrode and the emission layer and includes a block copolymer, the block copolymer includes at least one hydrophilic block and at least one hydrophobic block, and the emission layer includes a perovskite structure.

In an embodiment, at least one surface of the emission layer may be in direct contact with at least one surface of the auxiliary layer.

In an embodiment, the auxiliary layer consists essentially of the block copolymer.

In an embodiment, the at least one hydrophilic block may be closer to the at least one surface of the auxiliary layer in direct contact with the emission layer, and the at least one hydrophobic block may be closer to a surface of the auxiliary layer facing the at least one surface of the auxiliary layer.

In an embodiment, a thickness of the auxiliary layer may be greater than 0 nm to about 10 nm.

In an embodiment, the at least one hydrophilic block may include at least one hydrophilic group.

In an embodiment, the hydrophilic group may be at least one of a hydroxyl group, a sulfuric acid group, a substituted or unsubstituted amino group, a carboxyl group or a salt thereof, a sulfonic acid or a salt thereof, or a phosphoric acid or a salt thereof.

In an embodiment, the block copolymer may be a di-block copolymer including a hydrophilic block-hydrophobic block structure, or a tri-block copolymer including a hydrophilic block-hydrophobic block-hydrophilic block structure.

In an embodiment, the at least one hydrophilic block and the at least one hydrophobic block may each independently be at least one of a polyalkyleneoxide block, a polyester block, or a poly(meth)acryl block.

In an embodiment, the at least one hydrophilic block and the at least one hydrophobic block may each independently be a polyalkyleneoxide block.

In an embodiment, the light-emitting device may further include a first charge transport layer between the first electrode and the auxiliary layer, and the first charge transport layer may include a hydrophobic material.

In an embodiment, the first charge transport layer may be in direct contact with the auxiliary layer.

In an embodiment, the perovskite structure may be represented by Formula 1 below $$[A^1][Q^1][X^1]_3 \qquad \text{Formula 1}$$

wherein, in Formula 1, $A^1$ may be at least one of a monovalent organic cation or a monovalent inorganic cation, $Q^1$ may be at least one of a divalent metal cation or a divalent metalloid cation, and $X^1$ may be at least one monovalent halogen ion.

In an embodiment, the perovskite structure may have a polycrystalline structure.

In an embodiment, the emission layer may include a first emission layer including a three-dimensional perovskite structure and a second emission layer including a two-dimensional perovskite structure.

In an embodiment, the emission layer may further include an organic ligand, the perovskite structure may be nanocrystal perovskite having a nanocrystal structure, and the organic ligand may surround at least one surface of the nanocrystal perovskite.

In an embodiment, the emission layer may further include a polymer, and the polymer may include at least one of polyalkyleneoxide or polyimide.

In an embodiment, the light-emitting device may further include a hole transport region located between the first electrode and the emission layer and/or an electron transport region located between the emission layer and the second electrode.

In an embodiment, the light-emitting device may further include a charge control layer located between the first electrode and the emission layer and/or between the emission layer and the second electrode.

According to an embodiment, a method of manufacturing a light-emitting device, the method includes providing an activation layer on a first electrode, the activation layer including an emission layer and an auxiliary layer; and providing a second electrode on the activation layer, the second electrode facing the first electrode, wherein the providing of the activation layer includes: providing the auxiliary layer on the first electrode; and providing the emission layer on the auxiliary layer, wherein the auxiliary layer includes a block copolymer, the block copolymer includes at least one hydrophilic block and at least one hydrophobic block, and the emission layer includes a perovskite structure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
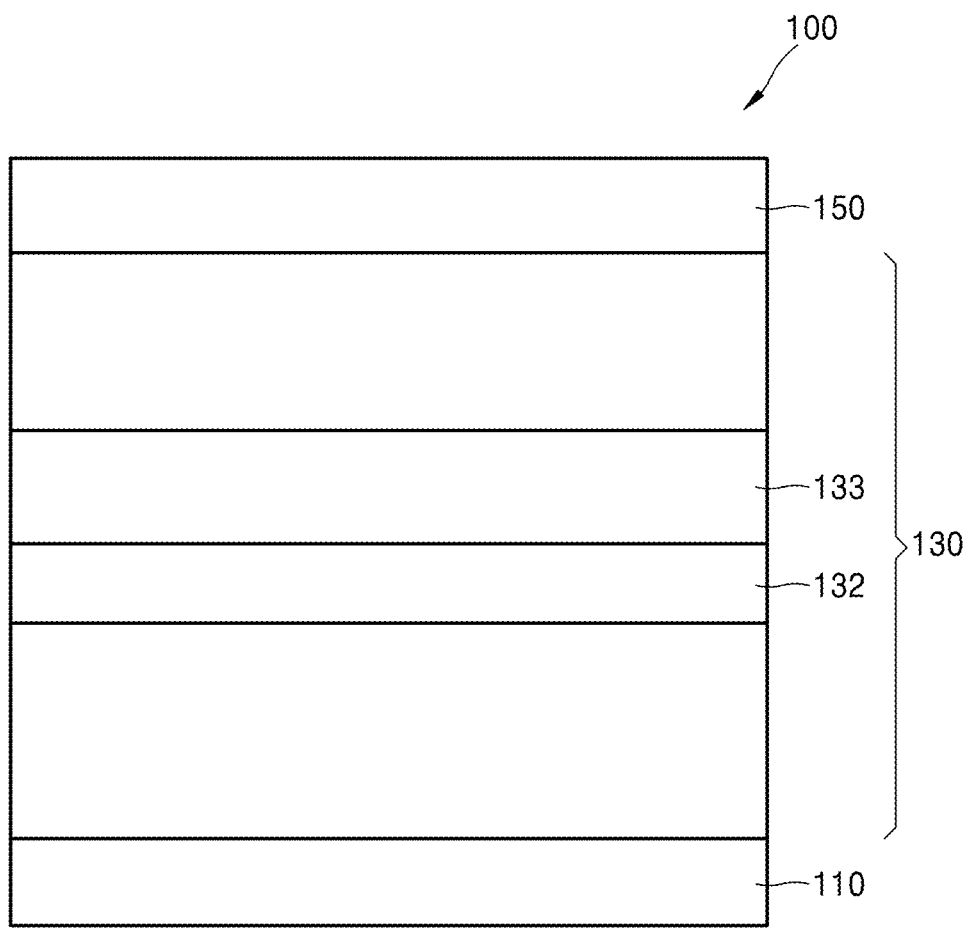
FIG. 1 is a schematic cross-sectional view of a light-emitting device according to an embodiment.
Figure 2:
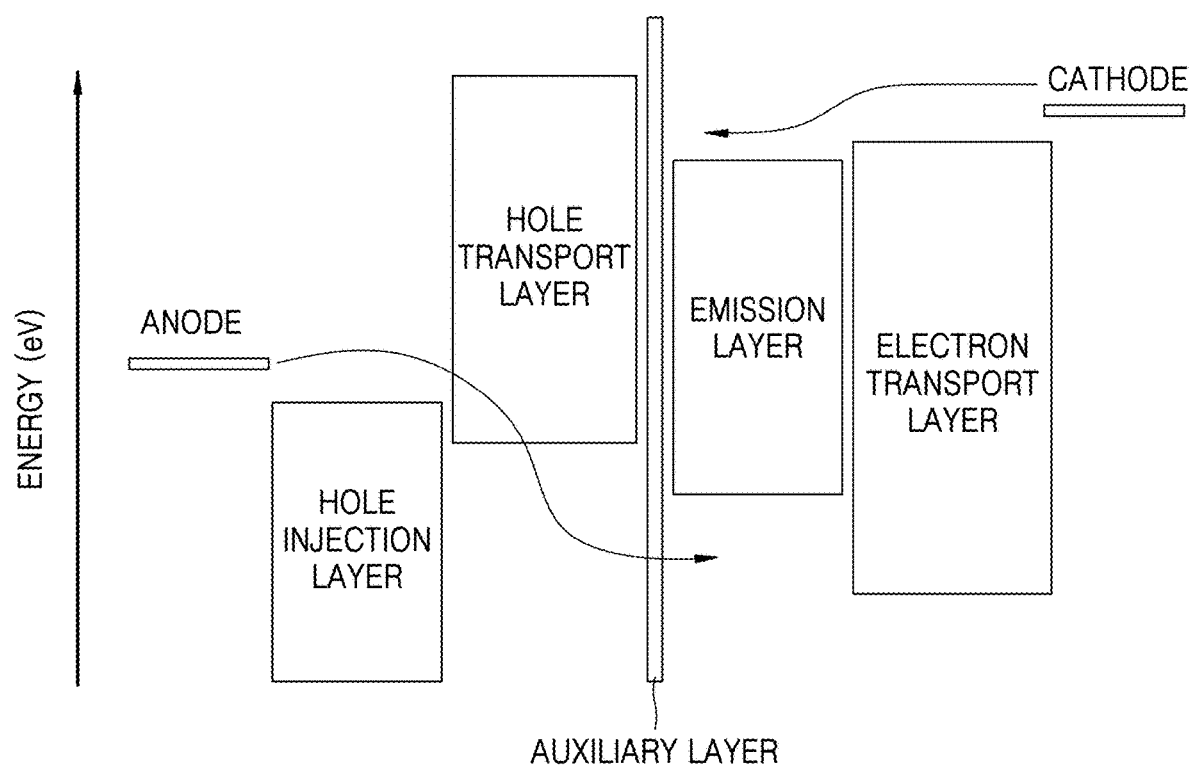
FIG. 2 schematically illustrates an energy diagram of a light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

As the present disclosure can apply various transformations and can have various examples, specific examples will be illustrated in the drawings and described in detail in the detailed description. Effects and features of the present disclosure, and methods of achieving the same will be clarified by referring to Examples described in detail later with reference to the drawings. However, the present disclosure is not limited to the examples disclosed below and may be implemented in various forms.

The terms as used in the present specification are selected as general terms that are currently widely used in consideration of functions in the present disclosure. However, the terms may vary depending on the intentions or precedents of those skilled in the art, and emergence of new technologies. In addition, in certain cases, some terms are arbitrarily selected by an applicant, and in this case, the meaning of the terms will be described in detail in the detailed description of the corresponding disclosure. Therefore, the terms as used in the present specification should be defined based on the meaning of the terms and the contents throughout the present specification, rather than the name of the terms.

In the present specification, when a portion "includes" an element, another element may be further included, unless otherwise described.

Like reference numerals in the drawings denote like elements, and sizes of elements in the drawings may be exaggerated or reduced for clarity and convenience of explanation.

It will be understood that when a component, such as a layer, a film, a region, or a plate, is referred to as being "on" another component, the component can be directly on the other component or intervening components may be present thereon. Conversely, it will be understood that when a portion is "directly on" another portion, intervening portions may not be present thereon.

As used herein, the singular forms "a," "an," and "the" are intended to include the plural forms as well, unless the context clearly indicates otherwise.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% or 1% of the stated value.

In the present specification, the term "perovskite structure" as used herein collectively refers to a compound in which a first cation is at (0,0,0), a second cation is at (½,½,½), and an anion is at (½,½,0) in a unit cell. In the present specification, it is understood that a perovskite structure has not only an ideal symmetry structure of $CaTiO_3$, but also a distorted structure having a lower-symmetry.

In the present specification, the term "three-dimensional perovskite structure" as used herein collectively refers to a perovskite structure having a three-dimensional crystal structure.

In the present specification, the term "two-dimensional perovskite structure" as used herein collectively refers to a perovskite structure having not a three-dimensional structure, but a two-dimensional crystal structure or quasi-two-dimensional crystal structure.

In the present specification, the term "Group" refers to a group on the International Union of Pure and Applied Chemistry (IUPAC) Periodic Table of Elements.

In the present specification, the term "alkali metal" as used herein refers to an element of Group 1 of the Periodic Table of Elements.

The term "halogen" as used herein refers to an element of Group 17 of the Periodic Table of Elements.

Hereinafter, a light-emitting device will be described in detail with reference to the accompanying drawings.

Light-Emitting Device

According to an embodiment, there is provided a light-emitting device 100 including: a first electrode 110; a second electrode 150 facing the first electrode 110; and an activation layer 130 located between the first electrode 110 and the second electrode 150 and including an emission layer 133 and an auxiliary layer 132, wherein the auxiliary layer 132 is located between the first electrode 110 and the emission layer 133, the auxiliary layer 132 includes a block copolymer, the block copolymer includes at least one hydrophilic block and at least one hydrophobic block, and the emission layer 133 includes a perovskite structure.

The structure of the light-emitting device 100 will be described with reference to FIG. 1. FIG. 1 is a schematic cross-sectional view of the light-emitting device 100 according to an embodiment.

Although not shown in FIG. 1, a substrate may be additionally located below the first electrode 110 (on an opposite side of the emission layer 133) and/or on the second electrode 150 (on an opposite side of the emission layer 133). For use as the substrate, any substrate that is used in general light-emitting devices may be used, and the substrate may be a glass substrate or a transparent plastic substrate, each having excellent mechanical strength, thermal stability, transparency, surface smoothness, ease of handling, and water resistance.

In an embodiment, the first electrode 110 may be an anode to which a positive (+) voltage is applied, and the second electrode 150 may be a cathode to which a negative (−) voltage is applied. In an embodiment, the first electrode 110 may be a cathode, and the second electrode 150 may be an anode. For convenience, as described herein, the first electrode 110 is an anode, and the second electrode 150 is a cathode.

The first electrode 110 may be formed by, for example, depositing or sputtering a material for forming the first electrode 110 on the substrate. The first electrode 110 may be a reflective electrode, a semi-reflective electrode, or a transmissive electrode. In order to obtain a bottom-emitting light-emitting device, the first electrode 110 may be a semi-transmissive electrode or a transmissive electrode, and to obtain a top-emitting light-emitting device, the first electrode 110 may be a reflective electrode. As such, various modifications are available. The first electrode 110 may have a single-layered structure or a multi-layered structure including two or more layers.

The first electrode 110 may include a material with a high work function to facilitate hole injection. A material for forming the first electrode 110 may include at least one of fluorine-doped tin oxide (FTO), indium tin oxide (ITO), indium zinc oxide (IZO), aluminum-doped zinc oxide (AZO), indium oxide, tin oxide ($SnO_2$), zinc oxide (ZnO), gallium oxide, aluminum oxide, or magnesium oxide. In an embodiment, the material for forming the first electrode 110 may include metal, such as at least one of magnesium (Mg), aluminum (Al), aluminum-lithium (Al—Li), calcium (Ca), magnesium-indium (Mg—In), or magnesium-silver (Mg—Ag).

The second electrode 150 may be provided to face the first electrode 110. The second electrode 150 may be a reflective electrode, a semi-reflective electrode, or a transmissive electrode. To obtain a bottom-emitting light-emitting device, the second electrode 150 may be a reflective electrode, and to obtain a top-emitting light-emitting device, the second electrode 150 may be a semi-transmissive electrode or a transmissive electrode. As such, various modifications are available. The second electrode 150 may have a single-layered structure or a multi-layered structure including two or more layers.

The second electrode 150 may include at least one of a metal, an alloy, or an electrically conductive compound, each having a relatively low work function. A material for forming the second electrode 150 may include Li, Mg, Al, Al—Li, Ca, Ga, Mg—In, Mg—Ag, or a combination thereof. In an embodiment, the material for forming the second electrode 150 may include at least one of ITO or IZO.

The activation layer 130 is located between the first electrode 110 and the second electrode 150. The activation layer 130 may include the auxiliary layer 132 and the emission layer 133. The auxiliary layer 132 is located between the first electrode 110 and the emission layer 133.

In an embodiment, the auxiliary layer 132 may include a block copolymer, and the block copolymer may include at least one hydrophilic block and at least one hydrophobic block.

When providing an emission layer including a perovskite structure, a solution process may be used to improve crystallinity. Such a perovskite structure-including light-emitting device including an emission layer provided by a solution process may have relatively improved light and/or electrical characteristics.

However, there are limitations that should satisfy conditions in order to use the solution process. For example, when a precursor for forming a perovskite structure is highly soluble in a solvent having high hydrophilicity, a solution containing the precursor for forming the perovskite structure may be provided on a surface having high hydrophilicity.

However, charge transport materials, such as a charge transport polymer and/or a charge transport organic semiconductor, have high hydrophobicity. Thus, when providing the solution containing the precursor for forming a perovskite structure on a charge transport layer including such a charge transport material, a uniform thin film may not be easily obtained.

When the charge transport layer is treated with UV-ozone to reduce the hydrophobicity, a uniform emission layer may be obtained. However, a conjugate structure of the charge transport material may be broken, resulting in degraded electrical characteristics of a light-emitting device. Accordingly, such a light-emitting device may have low external quantum efficiency.

Conversely, when a metal oxide having high hydrophilicity is used for a charge transport layer to improve uniformity of an emission layer, a band gap of the charge transport layer is difficult to control. In this regard, a light-emitting device including the charge transport layer may have poor characteristics.

However, the light-emitting device 100 according to an embodiment includes the auxiliary layer 132, and the auxiliary layer 132 includes the block copolymer including at least one hydrophilic block and at least one hydrophobic block. In this regard, even when a charge transport polymer and/or a charge transport organic semiconductor, each having high hydrophobicity, for a charge transport layer, uniform thin-film characteristics of the emission layer 133 may be obtained. In particular, the at least one hydrophobic block may be closer to an interface between the charge transport layer and the auxiliary layer 132, and the at least one hydrophilic block may be arranged far away from the interface. In this regard, even when the solution containing the precursor for forming a perovskite structure is provided on the auxiliary layer 132, the uniformity of the emission layer 133 may be improved. In an embodiment, a contact angle (CA) with water droplets on a surface of the charge transport layer is 96.8°. However, when the auxiliary layer 132 including the block copolymer that includes the at least one hydrophilic block and the at least one hydrophobic block is provided, the CA with water droplets on a surface of the auxiliary layer 132 is significantly lowered to 10.4°. In general, is the layer said to be 'hydrophobic' when the CA with water droplets exceeds 70°.

In an embodiment, one surface of the emission layer 133 may be in direct contact with one surface of the auxiliary layer 132. As described herein, the emission layer 133 is formed on the auxiliary layer 132 such that at least one surface of the emission layer 133 may be in direct contact with at least one surface of the auxiliary layer 132.

In an embodiment, the auxiliary layer 132 consists essentially of, or consists of, the block copolymer. In particular, the auxiliary layer 132 does not include a material, such as an organic semiconductor or a light-emitting material, other than the block copolymer.

In an embodiment, the at least one hydrophilic block may be closer to the at least one surface of the auxiliary layer 132 in direct contact with the emission layer 133, and the at least one hydrophobic block may be closer to a surface of the auxiliary layer 132 facing the one surface of the auxiliary layer 132. Accordingly, the hydrophilicity of the at least one surface of the auxiliary layer 132 in direct contact with the emission layer 133 may be improved, and even when the solution containing the precursor for forming a perovskite structure is provided on the auxiliary layer 132, the uniformity of the emission layer 133 may be improved.

In an embodiment, a thickness of the auxiliary layer 132 may be about 10 nm or less. In an embodiment, the thickness of the auxiliary layer 132 may be greater than 0 nm and about 3 nm or less, or may be about 2 nm or more and about 3 nm or less. However, embodiments of the present disclosure are not limited thereto. When the thickness of the auxiliary layer 132 is satisfied within the ranges above, the light-emitting device 100 having high luminance without degradation of electrical characteristics may be provided. When the thickness of the auxiliary layer 132 is greater than about 10 nm, the luminance of the light-emitting device 100 may be decreased.

The at least one hydrophilic block included in the block copolymer may include at least one hydrophilic group. In an embodiment, the at least one hydrophilic group may be located at the terminus of each of the at least one hydrophilic block.

For example, the at least one hydrophilic group may be at least one of a hydroxyl group, a sulfuric acid group, a substituted or unsubstituted amino group, a carboxyl group or a salt thereof, a sulfonic acid or a salt thereof, or a phosphoric acid or a salt thereof.

The block copolymer may be a di-block copolymer having a hydrophilic block-hydrophobic block structure, or a tri-block copolymer having a hydrophilic block-hydrophobic block-hydrophilic block structure.

The block copolymer may be a tri-block copolymer having a hydrophilic block-hydrophobic block-hydrophilic block structure. The at least one hydrophilic block may be closer to the one surface of the auxiliary layer 132 in direct contact with the emission layer 133, and the at least one hydrophobic block may be closer to the other surface of the auxiliary layer 132 facing the one surface of the auxiliary layer 132. Accordingly, the block copolymer may be arranged in a " 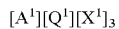 " shape on the surfaces of the auxiliary layer 132.

For example, the at least one hydrophilic block and the at least one hydrophobic block may each independently be at least one of a polyalkyleneoxide block, a polyester block, or a poly(meth)acryl block. As used herein, a poly(meth)acryl block includes units derived from at least one of an acrylic acid, a methacrylic acid, a (C1 to C12 alkyl) acrylate, or a (C1 to C12 alkyl) methacrylate. In an embodiment, the at least one hydrophilic block and the at least one hydrophobic block may each independently be a polyalkyleneoxide block, but embodiments are not limited thereto. In an embodiment, the at least one hydrophilic block may be a polyethylene oxide block, and the at least one hydrophobic block may be a polypropylene oxide block. However, embodiments are not limited thereto.

The emission layer 133 may include a perovskite structure represented by Formula 1:

$$[A^1][Q^1][X^1]_3 \qquad \text{Formula 1}$$

In Formula 1, $A^1$ may be at least one of a monovalent organic cation or a monovalent inorganic cation, $Q^1$ may be at least one of a divalent metal cation or a divalent metalloid cation, and $X^1$ may be at least one monovalent halogen ion.

For example, in Formula 1, Al may be at least one of an ammonium ion, an alkylammonium ion, an arylammonium ion, an arylalkylammonium ion, a formamidinium ion, an alkylamidinium ion, an arylamidinium ion, an arylalkylamidinium ion, or an alkali metal ion, $Q^1$ may be at least one of $Pb^{2+}$, $Sn^{2+}$, $Bi^{2+}$, $Sb^{2+}$, $Cu^{2+}$, $Ag^{2+}$, $Au^{2+}$, $La^{2+}$, $Ce^{2+}$, $Pr^{2+}$, $Nd^{2+}$, $Pm^{2+}$, $Sm^{2+}$, $Eu^{2+}$, $Gd^{2+}$, $Tb^{2+}$, $Dy^{2+}$, $Ho^{2+}$, $Er^{2+}$, $Tm^{2+}$, $Yb^{2+}$, $Lu^{2+}$, $Be^{2+}$, $Mg^{2+}$, $Ca^{2+}$, $Sr^{2+}$, $Ba^{2+}$, or $Ra^{2+}$, and $X^1$ may be at least one of $Cl^-$, $Br^-$, or $I^-$.

In an embodiment, in Formula 1, $A^1$ may be at least one of a methylammonium (MA) ion, a formamidinium (FA) ion, or $Cs^+$, $Q^1$ may be at least one of $Pb^{2+}$, $Bi^{2+}$, $Cu^{2+}$, $Ag^{2+}$, or $Au^{2+}$, and $X^1$ may be at least one of $Cl^-$, $Br^-$, or $I^-$.

In an embodiment, the perovskite structure may be $CsPbBr_3$.

For example, the perovskite structure may have a polycrystalline structure.

In an embodiment, the emission layer 133 may include a first emission layer including a three-dimensional perovskite structure and a second emission layer including a two-dimensional perovskite structure. When electric power is applied between the first electrode 110 and the second electrode 150, light may be emitted at an interface between the first emission layer and the second emission layer.

In an embodiment, the emission layer 133 may further include, in addition to the perovskite structure, an organic ligand. Here, the perovskite structure may be a nanocrystal perovskite having a nanocrystal structure, and the organic ligand may surround at least one surface of the nanocrystal perovskite. In this regard, the perovskite may include a colloidal perovskite quantum dot (CQD).

For example, the organic ligand may include at least one of an alkylhalide or an organic acid.

In the emission layer 133, electrons and holes that are transferred by voltage supplied by the first electrode 110 and the second electrode 150 may recombine. Such electrons and holes may recombine to produce excitons, and these excitons transit from an excited state to a ground state to thereby generate light. By including the perovskite structure, the light-emitting device 100 may have high color purity, high current efficiency, and high quantum efficiency.

When the light-emitting device 100 is a full color light-emitting device, the emission layer 133 may emit light of different color for each sub-pixel.

For example, the emission layer 133 may be patterned into a first-color emission layer, a second-color emission layer, and a third-color emission layer, according to a sub-pixel. Here, at least one of the first-color emission layer to the third-color emission layer may essentially include the perovskite structure. The first-color emission layer may be an emission layer including the first perovskite, and the second-color emission layer and the third-color emission layer may be organic emission layers which each include a different organic compound. The first color to the third color are different colors, and specifically, the first color to the third color may each have a different maximum emission wavelength. The first color to the third color may be combined with each other, to thereby generate white color.

In an embodiment, the emission layer 133 may further include a fourth-color emission layer, and at least one of the first-color emission layer to the fourth-color emission layer may be an emission layer including the perovskite structure, and the others may be emission layers each including a different organic compound. As such, various modifications are available. Here, the first color to the fourth color are different colors, and specifically, the first color to the fourth color may each have a different maximum emission wavelength. The first color to the fourth color may be combined with each other, to thereby generate white color.

In an embodiment, the light-emitting device 100 may have a structure in which two or more emission layers emitting different colors are in contact with each other or spaced apart from each other. At least one of the two or more emission layers may be an emission layer including the perovskite structure, and the other emission layers may each be an organic emission layer including an organic compound. As such, various modifications are available.

A thickness of the emission layer 133 may be in a range of about 100 nm to about 500 nm. When the thickness of the emission layer 133 is satisfied within the range above, excellent light-emission characteristics may be obtained without a substantial increase in driving voltage.

Between the first electrode 110 and the emission layer 133 and/or between the second electrode 150 and the emission layer 133, an additional layer may be further included to improve device characteristics by adjusting a charge carrier balance inside the light-emitting device 100.

For example, when the first electrode 110 is an anode, and the second electrode 150 is a cathode, the light-emitting device 100 may further include a hole transport region between the first electrode 110 and the emission layer 133 and an electron transport region between the second electrode 150 and the emission layer 133.

In an embodiment, when the first electrode 110 is a cathode, and the second electrode 150 is an anode, the light-emitting device 100 may further include an electron transport region between the first electrode 110 and the emission layer 133 and a hole transport region between the second electrode 150 and the emission layer 133.

The hole transport region may serve to inject and/or transport holes from the first electrode 110 to the emission layer 133. Additionally, the hole transport region may serve to increase efficiency by compensating for an optical resonance distance according to the wavelength of light emitted by the emission layer 133.

The hole transport region may have a single-layered structure or a multi-layered structure including two or more layers. The hole transport region may include only a hole injection layer or only a hole transport layer. In an embodiment, the hole transport region may have a hole injection layer/hole transport layer structure, wherein each layer is sequentially stacked in this stated order from the first electrode 110.

For example, the hole transport region may include a first charge transport layer (not shown). The first charge transport layer may be a hole transport layer.

In an embodiment, the first charge transport layer may be in direct contact with the auxiliary layer 132.

In an embodiment, a thickness of the first charge transport layer may be in a range of about 100 nm to about 1,000 nm. When the thickness of the first charge transport layer is within this range, excellent light-emission characteristics may be obtained without a substantial increase in driving voltage.

The first charge transport layer may include a hydrophobic material.

For example, the first charge transport layer may include a charge transport polymer and/or a charge transport organic semiconductor.

The first charge transport layer may include, for example, at least one of 1,3-bis(9-carbazolyl)benzene (mCP), 4,4'-bis(N-carbazolyl)-1,1'-biphenyl (CBP), 3,3-bis(carbazol-9-yl)biphenyl (mCBP), 4,4',4"-tris[phenyl(m-tolyl)amino]triphenylamine (m-MTDATA), TDATA, 2-TNATA, N, N'-di(1-naphthyl)-N, N'-diphenyl-(1,1'-biphenyl)-4,4'-diamine (NPB), β-NPB, N,N'-bis(3-methylphenyl)-N,N'-diphenylbenzidine (TPD), spiro-TPD, spiro-NPB, methylated-NPB, TAPC, HMTPD, tris(4-carbazoyl-9-ylphenyl)amine (TCTA), polyaniline/dodecylbenzenesulfonic acid (PANI/DBSA), poly(3,4-ethylenedioxythiophene)/poly(4-styrenesulfonate) (PEDOT/PSS), poly(9,9-dioctyl-fluorene-co-N-(4-butylphenyl)-diphenylamine) (TFB), poly(fluorine-co-triphenylamine) (PFO-TPA), polyarylamine, poly(N-vinylcarbazole) (PVK), polypyrrole, polyaniline/camphor sulfonic acid (PANI/CSA), or polyaniline/poly(4-styrenesulfonate (PANI/PSS), but embodiments are not limited thereto:

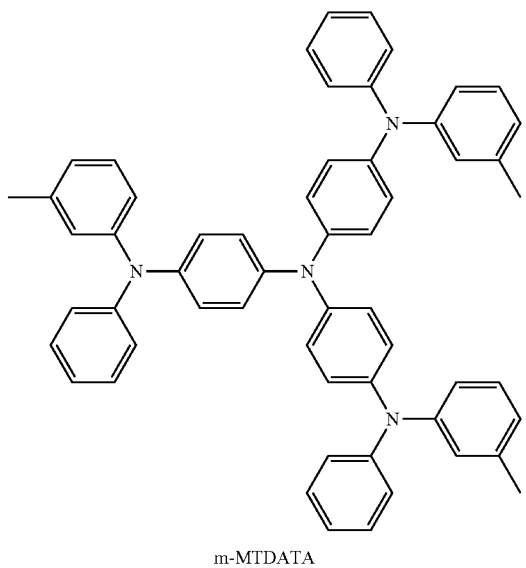

m-MTDATA

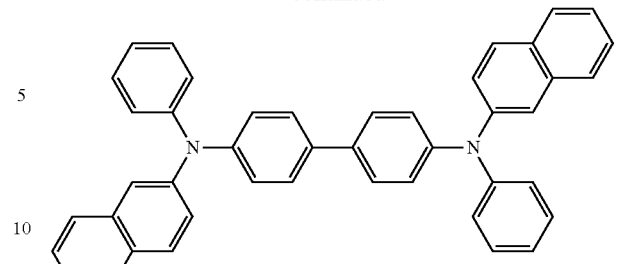
β-NPB
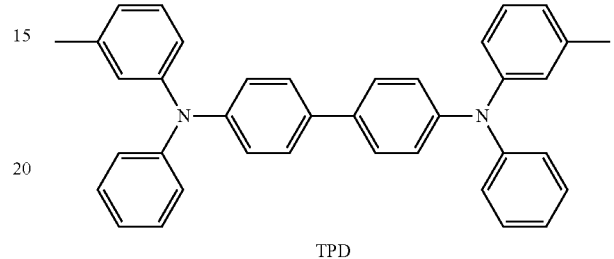
TPD
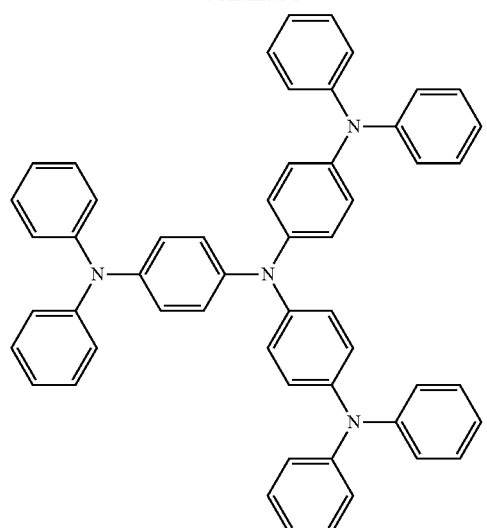
TDATA
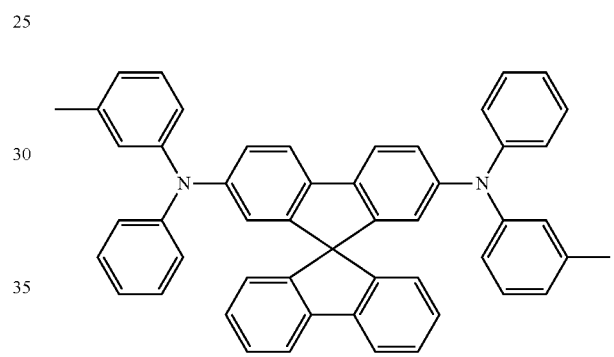
Spiro-TPD
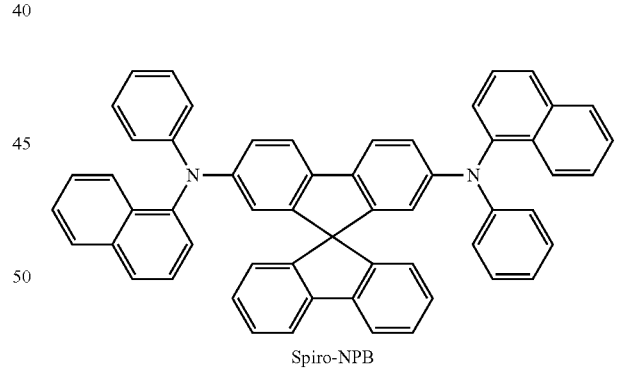
Spiro-NPB
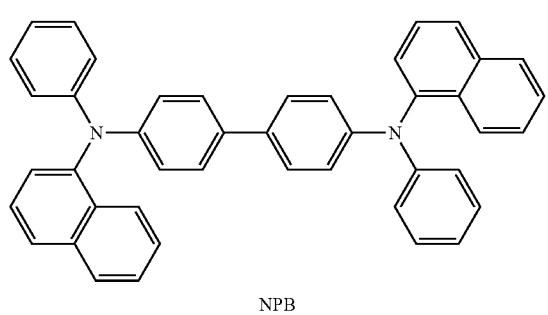
2-TNATA
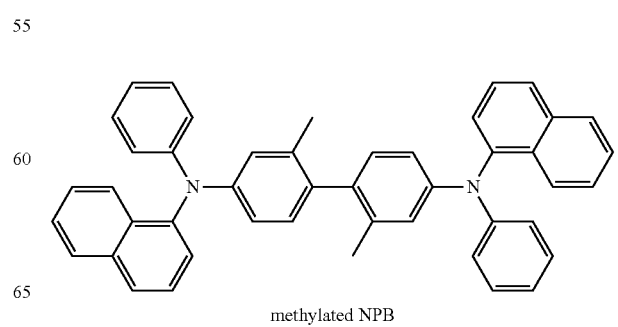
methylated NPB
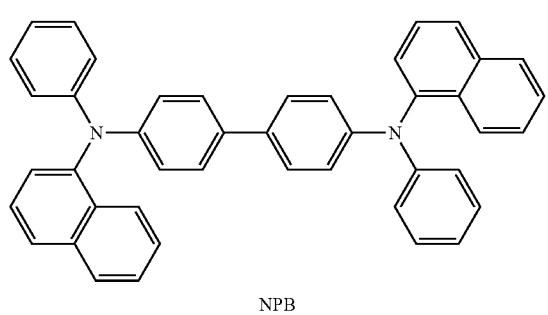
NPB

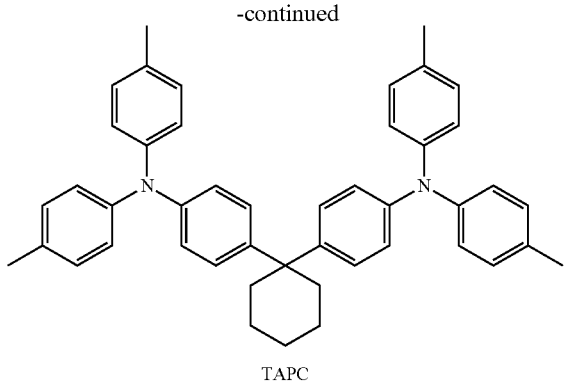

TAPC

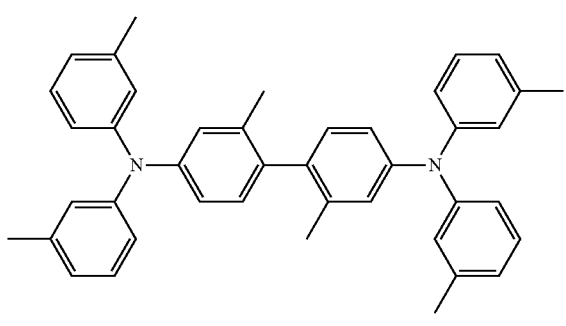

HMTPD

A thickness of the hole transport region may be determined in consideration of the wavelength of light emitted by the emission layer 133 and driving voltage and current efficiency of the light-emitting device 100. For example, the thickness of the hole transport region may be in a range of about 10 nm to about 1,000 nm, and for example, in a range of about 10 nm to about 100 nm. When the hole transport region includes both a hole injection layer and a hole transport layer, a thickness of the hole injection layer may be in a range of about 10 nm to about 200 nm, and a thickness of the hole transport layer may be in a range of about 5 nm to about 100 nm.

The hole transport region may further include, in addition to the foregoing materials, a p-dopant for the improvement of conductive properties. The p-dopant may be homogeneously or non-homogeneously dispersed in the hole transport region.

The p-dopant may be at least one of a quinone derivative, a metal oxide, or a cyano group-containing compound, but embodiments are not limited thereto. For example, non-limiting examples of the p-dopant are a quinone derivative, such as tetracyanoquinonedimethane (TCNQ) and 2,3,5,6-tetrafluoro-tetracyano-1,4-benzoquinonedimethane (F4-TCNQ); a metal oxide, such as a tungsten oxide and a molybdenum oxide; or a cyano group-containing group, such as dipyrazino[2,3-f:2',3'-h]quinoxaline-2,3,6,7,10,11-hexacarbonitrile (Compound HAT-CN), but embodiments are not limited thereto.

In an embodiment, the electron transport region may serve to inject and/or transport electrons from the second electrode 150 to the emission layer 133. Additionally, the electron transport region may serve to increase efficiency by compensating for an optical resonance distance according to the wavelength of light emitted by the emission layer 133.

The electron transport region may include at least one of an electron injection layer, an electron transport layer, or a charge control layer. The electron transport region may have a single-layered structure or a multi-layered structure including two or more layers. The electron transport region may include only an electron injection layer or only an electron transport layer. In an embodiment, the hole transport region may have an electron transport layer/electron injection layer structure or a charge control layer/electron transport layer/electron injection layer structure, wherein, for each structure, each layer is sequentially stacked in this stated order from the emission layer 133.

The electron transport region may include, for example, at least one of Alq$_3$, bathocuproine (BCP), 4,7-diphenyl-1,10-phenanthroline (Bphen), bis(2-methyl-8-quinolinolato-N1, O8)-(1,1'-biphenyl-4-olato)aluminum (BAlq), 3-(biphenyl-4-yl)-5-(4-tert-butylphenyl)-4-phenyl-4H-1,2,4-triazole (TAZ), 4-(naphthalen-1-yl)-3,5-diphenyl-4H-1,2,4-triazole (NTAZ), bis(10-hydroxybenzo[h]quinolinato)beryllium (Bebq$_2$), B$_3$PYMPM, TPBI, 3TPYMB, BmPyPB, TmPyPB, BSFM, PO-T2T, PO15, or (8-(4-(4,6-di(naphthalen-2-yl)-1,3,5-triazin-2-yl)phenyl)quinolone (ET204), but embodiments are not limited thereto. The electron transport layer and/or the charge control layer may include at least one of the compounds above, but embodiments are not limited thereto.

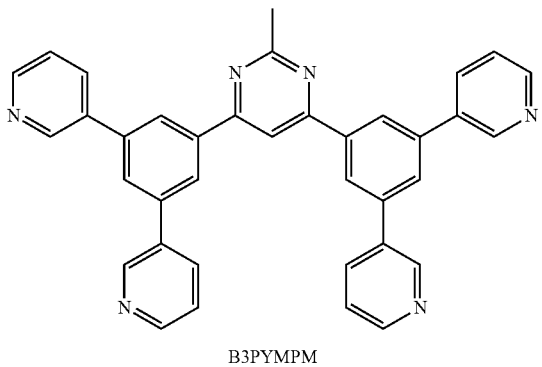

B3PYMPM

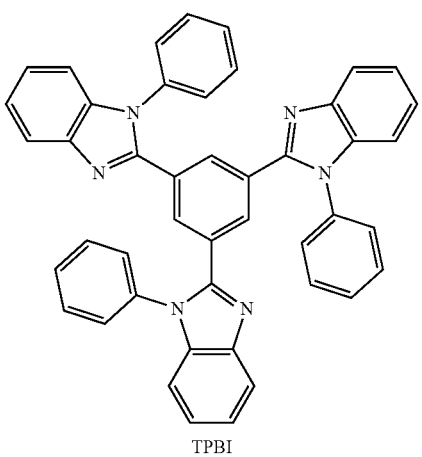

TPBI

-continued

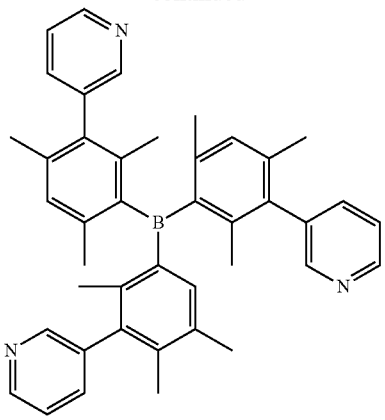

3TPYMB

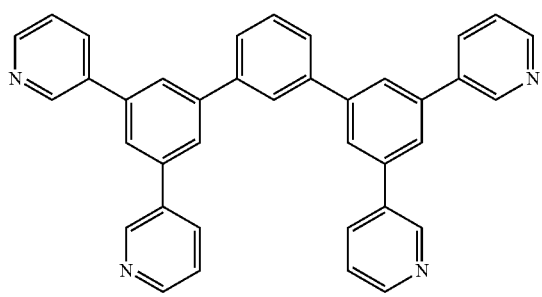

BmPyPB

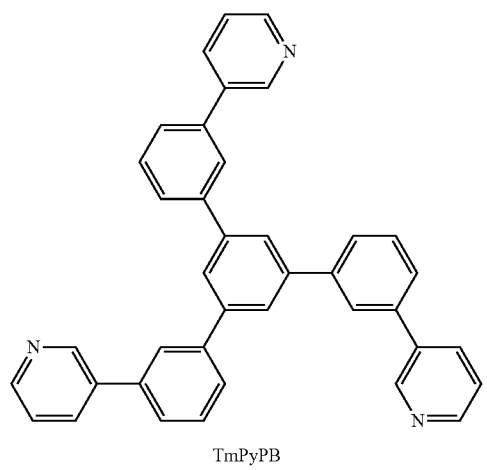

TmPyPB

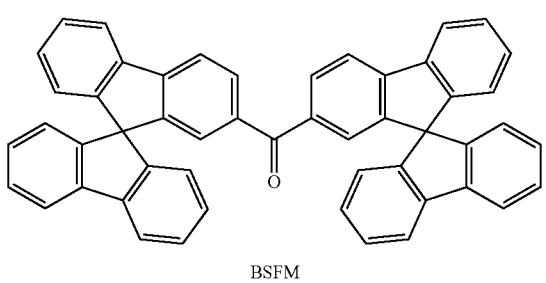

BSFM

-continued

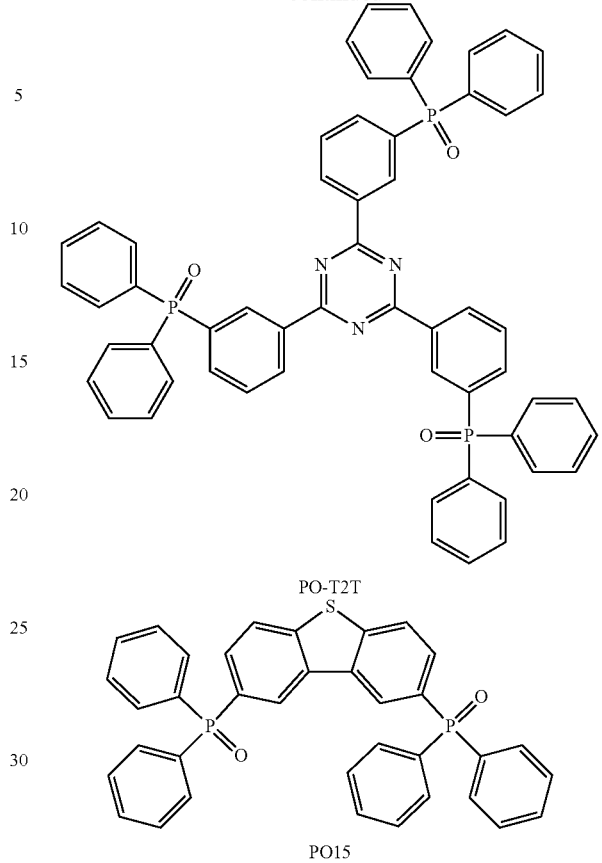

PO-T2T

PO15

The electron injection layer includes at least one of an alkali metal, an alkaline earth metal, a rare earth metal, an alkali metal compound, an alkaline earth-metal compound, a rare earth metal compound, an alkali metal complex, an alkaline earth-metal complex, or a rare earth metal complex. In an embodiment, the electron layer consists of at least one of the foregoing compounds or a combination the foregoing compounds. In an embodiment, the electron injection layer may further include the organic materials described herein, but embodiments are not limited thereto.

In an embodiment, the electron injection layer consists essentially of at least one of LiF, NaF, CsF, KF, $Li_2O$, $Cs_2O$, $K_2O$, BaO, SrO, CaO, lithium-8-hydroxy-quinolinolate (LiQ), or Cs, or may further include the organic compound described above. In an embodiment, the electron injection layer consists of at least one of LiF, NaF, CsF, KF, $Li_2O$, $Cs_2O$, $K_2O$, BaO, SrO, CaO, lithium-8-hydroxy-quinolinolate (LiQ), or Cs. However, embodiments are not limited thereto.

A thickness of the electron transport region may be determined in consideration of the wavelength of light emitted by the emission layer 133 and driving voltage and current efficiency of the light-emitting device 100. For example, the thickness of the electron transport region may be in a range of about 1 nm to about 1,000 nm, and for example, in a range of about 10 nm to about 200 nm. When the electron transport region includes both an electron injection layer and an electron transport layer, a thickness of the hole injection layer may be in a range of about 1 nm to about 50 nm, and a thickness of the hole transport layer may be in a range of about 5 nm to about 100 nm.

The charge control layer may be included at an interface between a layer including an organic compound (for example, a hole transport layer, an electron transport layer, and the like) and a layer including an inorganic compound (for example, an emission layer) to control the charge injection balance. The charge control layer may include, for example, a polymer compound, such as poly(methyl methacrylate) (PMMA), polyimide (PI), poly(vinyl alcohol) (PVA), a combination thereof, or a copolymer thereof, but embodiments are not limited thereto. By including the charge control layer, the light-emitting device 100 may have improved charge injection balance, resulting in increased external quantum efficiency. In addition, as the charge control layer is located directly adjacent to the emission layer 133, the emission layer 133 may become flat, and thus lower the driving voltage of the light-emitting device 100.

The light-emitting device 100 has been described with reference to FIG. 1, but embodiments are not limited thereto.

Method of Manufacturing Light-Emitting Device

According to an embodiment, there is provided a method of manufacturing a light-emitting device, the method including: providing an activation layer on a first electrode, the activation layer including an emission layer and an auxiliary layer; and providing a second electrode on the activation layer, the second electrode facing the first electrode, wherein the providing of the activation layer includes: providing the auxiliary layer on the first electrode; and providing the emission layer on the auxiliary layer, wherein the auxiliary layer includes a block copolymer, the block copolymer includes at least one hydrophilic block and at least one hydrophobic block, and the emission layer includes a perovskite structure.

The auxiliary layer and the emission layer may each be provided by a solution process, and specifically, by a spin coating process.

In an embodiment, the auxiliary layer may be provided by spin-coating the first electrode or a hole transport region located on the first electrode with a first mixture including the block copolymer, and then, by drying the first electrode or the hole transport region.

An amount of the block copolymer in the first mixture may be in a range of about 0.1 weight percent (wt %) to about to 10 wt %. The amount of the block copolymer in the first mixture may be about 1 wt % or more and about 3 wt % or less, but embodiments are not limited thereto. When the amount of the block copolymer is satisfied within the ranges above, the auxiliary layer may have a suitable thickness for providing a light-emitting device having high luminance along with improved electrical characteristics.

A type of a solvent included in the first mixture is not particularly limited, so long as the solvent is suitable to dissolve or disperse the block copolymer. For example, the solvent included in the first mixture may be an alcohols, and specifically, may be ethanol.

In an embodiment, the emission layer may be provided by spin-coating the auxiliary layer with a second mixture including the perovskite structure.

For example, the second mixture may further include an organic ligand or a polymer.

In an embodiment, the emission layer may be provided by spin-coating the auxiliary layer with a third mixture including the precursor for forming perovskite, and then, by adding an antisolvent thereto for crystallization.

A solvent included in the third mixture may be selected from materials having high solubility to the precursor for forming a perovskite structure. For example, the solvent included in the third mixture may include dimethyl formamide, dimethyl sulfoxide, γ-butyrolactone, N-methyl-2-pyrrolidone, or a combination thereof. However, embodiments are not limited thereto.

The antisolvent may be selected from materials having low solubility to the precursor for forming a perovskite structure. For example, the antisolvent may include at least one of diethyl ether, toluene, α-terpineol, hexyl carbitol, diethylene glycol hexyl ether, butyl carbitol acetate, diethylene glycol n-butyl ether acetate, hexyl cellosolve, ethylene glycol monohexyl ether, butyl cellosolve acetate, or ethylene glycol n-butyl ether acetate. However, embodiments are not limited thereto. The antisolvent may be diethyl ether.

Next, by performing heat treatment, for example, on the emission layer, the solvent and the antisolvent included in the third mixture may be removed.

For example, conditions for the heat treatment may be selected in consideration of a composition of the mixtures in terms of time ranges (about 15 minutes to about 2 hours) and temperature ranges (about 50° C. to about 200° C.).

Each layer constituting the light-emitting device 100 may be formed by various methods including a dry process, such as vacuum deposition or an LB method, or a solution process, such as spin coating or casting.

When a hole injection layer is formed by vacuum deposition, the deposition conditions may vary according to a material used to form the hole injection layer, and the structure and thermal characteristics of the hole injection layer. For example, the deposition conditions may include a deposition temperature in a range of about 100° C. to about 500° C., a vacuum pressure in a range of about $10^{-8}$ torr to about $10^{-3}$ torr, and a deposition rate in a range of about 0.01 Å/sec to about 100 Å/sec. However, the deposition conditions are not limited thereto.

When the hole injection layer is formed by spin coating, the coating conditions may vary according to a material used to form the hole injection layer, and the structure and thermal properties of the hole injection layer. For example, a coating speed may be in a range of about 2,000 rpm to about 5,000 rpm, and a temperature at which a heat treatment is performed to remove a solvent after coating may be in a range of about 80° C. to about 200° C. However, the coating conditions are not limited thereto.

Hereinafter, a light-emitting device and a method of manufacturing the same according to embodiments are described in detail with reference to Examples and Comparative Examples. However, the present disclosure is not limited thereto.

EXAMPLES

Example 1

A light-emitting device having an ITO (anode)/molybdenum oxide (10 nm) (hole injection layer)/TFB (500 nm) (hole transport layer)/P123(2 nm) (auxiliary layer)/$CsPbBr_3$ (100 nm) (emission layer)/PMMA (10 nm) (charge control layer)/ET204(35 nm) (electron transport layer)/LiQ (1 nm) (electron injection layer)/Al (100 nm) (cathode) structure was manufactured.

The light-emitting device was manufactured as follows.

A molybdenum oxide ($MoO_x$) was thermally vacuum-deposited on an ITO substrate to form a hole injection layer having a thickness of 10 nm. Then, the ITO substrate was treated with UV-ozone for 20 minutes. TFB was spin-coated on the hole injection layer to form a hole transport layer having a thickness of 500 nm.

An ethanol solution containing 1.5 wt % of P123 (CAS No. 9003-11-6) was spin-coated on the hole transport layer to form an auxiliary layer having a thickness of 2 nm.

A $CsPbBr_3$ precursor solution was added dropwise to the auxiliary layer while spin-coating at a speed of 4,000 rpm for 10 seconds. Next, diethyl ether was added dropwise thereto by 0.5 ml/cm², and further spin-coated for 10 seconds. The ITO substrate was heat-treated on a hot plate (100° C.) to form an emission layer having a thickness of 100 nm.

By spin-coating a 1 wt % PMMA solution on the emission layer, a charge control layer having a thickness of 10 nm was formed.

ET204 was thermally vacuum-deposited on the charge control layer to form an electron transport layer having a thickness of 35 nm.

LiQ was thermally vacuum-deposited on the electron transport layer to form an electron injection layer having a thickness of 1 nm, and then, Al was thermally vacuum-deposited on the electron injection layer to form a cathode having a thickness of 100 nm, thereby completing the manufacture of the light-emitting device.

Comparative Example 1

A light-emitting device having an ITO (anode)/molybdenum oxide (10 nm) (hole injection layer)/TFB (500 nm) (hole transport layer)/$CsPbBr_3$(100 nm) (emission layer)/PMMA (10 nm) (charge control layer)/ET204(35 nm) (electron transport layer)/LiQ (1 nm) (electron injection layer)/Al (100 nm) (cathode) structure was manufactured.

The light-emitting device having the same structure as in Example 1 was manufactured, except that an auxiliary layer was not formed.

Comparative Example 2

A light-emitting device having an ITO (anode)/molybdenum oxide (10 nm) (hole injection layer)/TFB (500 nm) (hole transport layer)/$CsPbBr_3$(100 nm) (emission layer)/PMMA (10 nm) (charge control layer)/ET204(35 nm) (electron transport layer)/LiQ (1 nm) (electron injection layer)/Al (100 nm) (cathode) structure was manufactured.

The light-emitting device having the same structure as in Example 1 was manufactured, except that, an auxiliary layer was not formed and that the UV-ozone treatment was performed after a hole transport layer was formed and before an emission layer was formed.

Evaluation Example 1

Figure 3:
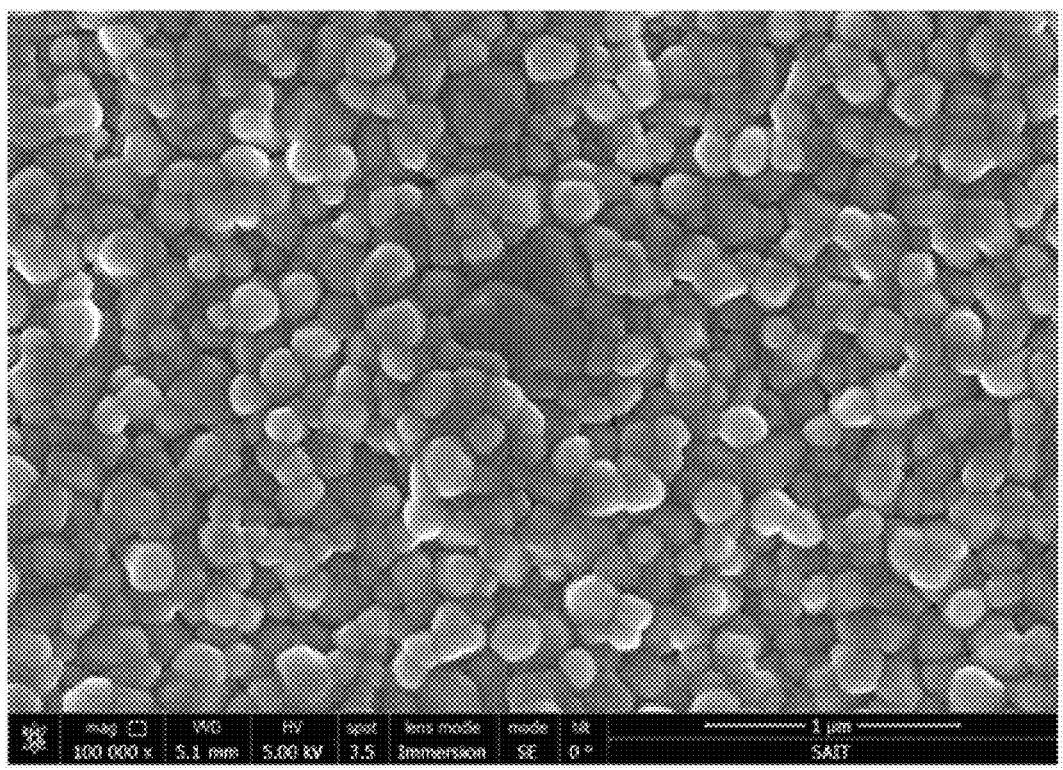
FIG. 3 is a scanning electron microscope (SEM) image of a surface of an emission layer of Example 1.

FIG. 3 shows the observation result of a sample by using a scanning electron microscope (SEM) after the emission layer was formed and before the electron transport layer was formed in Example 1.

Referring to Table 3, it was confirmed that the emission layer of Example 1 had high crystallinity.

Evaluation Example 2

Regarding the light-emitting devices of Example 1 and Comparative Examples 1 and 2, the current density versus voltage (V) characteristics, maximum external quantum efficiency (Max EQE), maximum luminance, and maximum emission wavelength ($\Delta_{max}$) were evaluated by using a current-voltage meter (Keithley 2400) and a luminance meter (Minolta Cs-1000A), and the results are shown in Table 1 and FIGS. 4A to 6B.

TABLE 1

| Example | Max EQE (%) | Maximum luminance (cd/m²) | $\lambda_{max}$ (nm) |
| --- | --- | --- | --- |
| Example 1 | 1.89 | 25000 | 523 |
| Comparative Example 1 | 1.65 | 3010 | 440 |
| Comparative Example 2 | 0.02 | 390 | 521 |

Referring to Table 1, it was confirmed that the light-emitting device of Example 1 had improved maximum EQE and improved maximum luminance compared to those of the light-emitting devices of Comparative Examples 1 and 2.

Figure 4A:
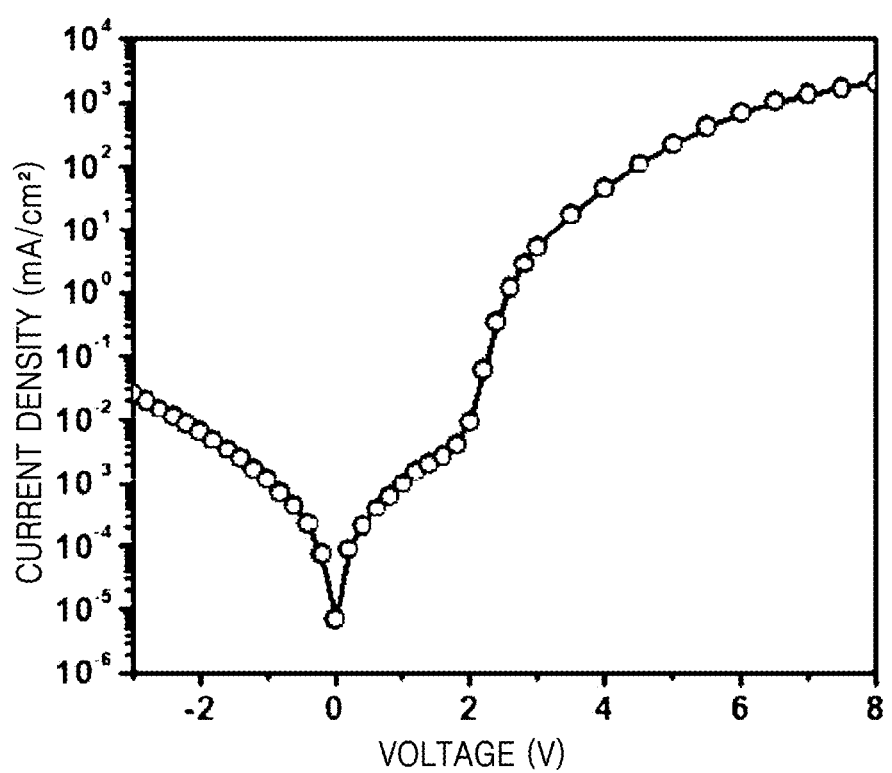
FIG. 4A is a graph of current density versus voltage (V) of Example 1.
Figure 4B:
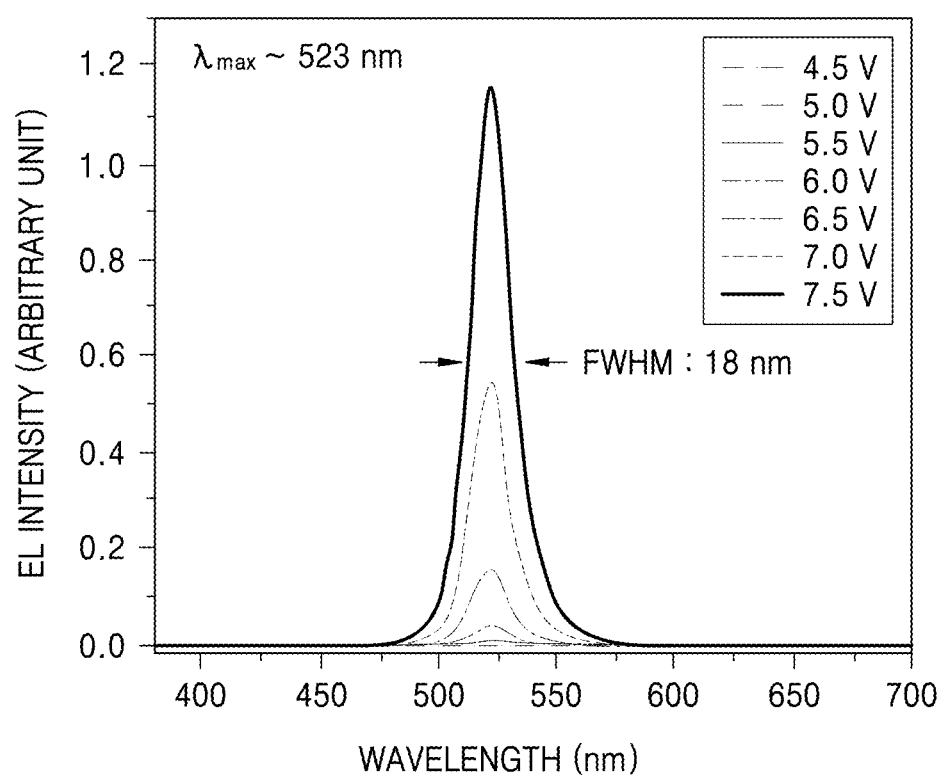
FIG. 4B is a diagram showing an electroluminescence spectrum of Example 1.
Figure 5:
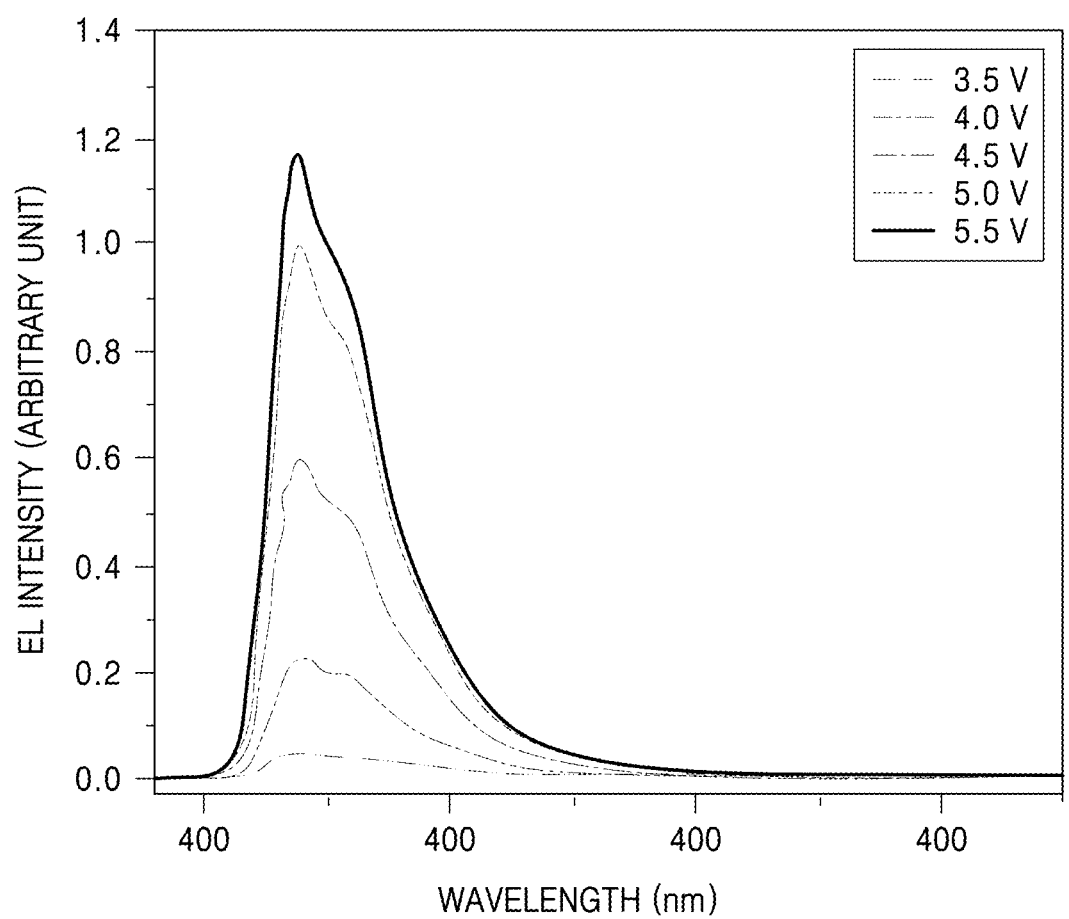
FIG. 5 is a diagram showing an electroluminescence spectrum of Comparative Example 1.

In addition, referring to FIGS. 4B and 5, it was confirmed that the light-emitting device of Comparative Example 1 showed different $\Delta_{max}$ values from those of the light-emitting device of Example 1. Without wishing to be bound by theory, it is understood that, in the case of Comparative Example 1, the emission layer was not substantially formed so that the light-emitting device of Comparative Example 1 showed $\lambda_{max}$ values corresponding to the emission wavelength of the hole transport layer.

Figure 6A:
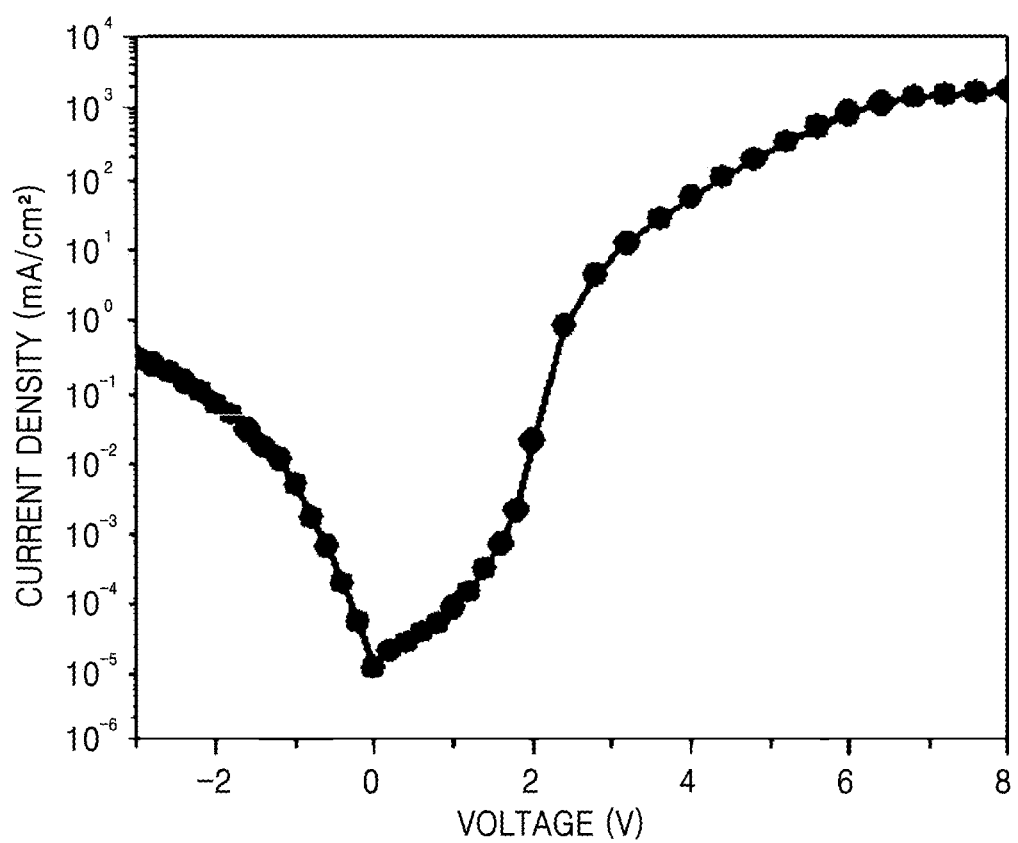
FIG. 6A a graph of current density versus voltage (V) of Comparative Example 2.
Figure 6B:
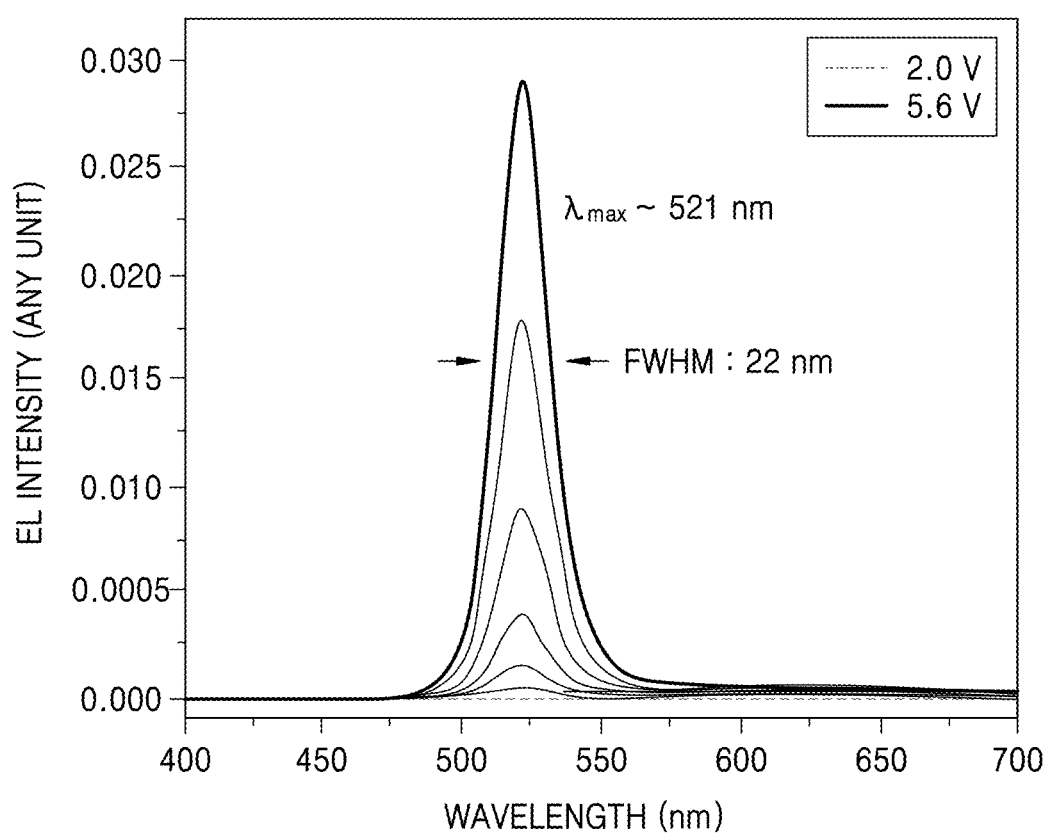
FIG. 6B is a diagram showing an electroluminescence spectrum of Comparative Example 2.

In addition, referring to FIGS. 4B and 6B, it was confirmed that the light-emitting device of Comparative Example 2 showed $\lambda_{max}$ values equivalent to those of the light-emitting device of Example 1. However, referring to Table 1, it was confirmed that the maximum EQE of the light-emitting device of Comparative Example 2 was reduced to 1/100 of the maximum EQE of the light-emitting device of Example 1. Without wishing to be bound by theory, such reduction is understood to be caused by degraded electrical characteristics of the light-emitting device in which the chemical structure of the hole transport layer was deformed by the UV-ozone treatment.

According to an embodiment, a light-emitting device includes an auxiliary layer including a block copolymer, and in this regard, the light-emitting device may include an emission layer having improved electrical characteristics on the auxiliary layer. Accordingly, defects and/or traps of the emission layer may be reduced, thereby providing the light-emitting device having improved efficiency and/or long lifespan.

It should be understood that embodiments described herein should be considered in a descriptive sense only and not for purposes of limitation. Descriptions of features, aspects, or advantages within each embodiment should be considered as available for other similar features, aspects, or advantages in other embodiments. While one or more embodiments have been described with reference to the figures, it will be understood by those of ordinary skill in the art that various changes in form and details may be made therein without departing from the spirit and scope as defined by the following claims.

What is claimed is:
1. A light-emitting device comprising:
a first electrode;
a second electrode facing the first electrode; and
an activation layer located between the first electrode and the second electrode and comprising an emission layer and an auxiliary layer, wherein the auxiliary layer is located between the first electrode and the emission layer,
the auxiliary layer comprises a block copolymer,
the block copolymer comprises at least one hydrophilic block and at least one hydrophobic block, and
the emission layer comprises a perovskite structure.

2. The light-emitting device of claim 1, wherein at least one surface of the emission layer is in direct contact with at least one surface of the auxiliary layer.

3. The light-emitting device of claim 1, wherein the auxiliary layer consists essentially of the block copolymer.

4. The light-emitting device of claim 2, wherein
the at least one hydrophilic block is closer to the at least one surface of the auxiliary layer in direct contact with the emission layer, and
the at least one hydrophobic block is closer to a surface of the auxiliary layer facing the at least one surface of the auxiliary layer.

5. The light-emitting device of claim 1, wherein a thickness of the auxiliary layer is greater than 0 nanometers to about 10 nanometers.

6. The light-emitting device of claim 1, wherein the at least one hydrophilic block comprises at least one hydrophilic group.

7. The light-emitting device of claim 6, wherein the at least one hydrophilic group is at least one of a hydroxyl group, a sulfuric acid group, a substituted or unsubstituted amino group, a carboxyl group or a salt thereof, a sulfonic acid or a salt thereof, or a phosphoric acid or a salt thereof.

8. The light-emitting device of claim 1, wherein the block copolymer is a di-block copolymer comprising a hydrophilic block-hydrophobic block structure, or a tri-block copolymer comprising a hydrophilic block-hydrophobic block-hydrophilic block structure.

9. The light-emitting device of claim 1, wherein the at least one hydrophilic block and the at least one hydrophobic block are each independently at least one of a polyalkyleneoxide block, a polyester block, or a poly(meth)acryl block.

10. The light-emitting device of claim 1, wherein the at least one hydrophilic block and the at least one hydrophobic block are each independently a polyalkyleneoxide block.

11. The light-emitting device of claim 1, wherein
the light-emitting device further comprises a first charge transport layer between the first electrode and the auxiliary layer, and
the first charge transport layer comprises a hydrophobic material.

12. The light-emitting device of claim 11, wherein the first charge transport layer is in direct contact with the auxiliary layer.

13. The light-emitting device of claim 1, wherein the perovskite structure is represented by Formula 1:

$$[A^1][Q^1][X^1]_3 \qquad \text{Formula 1}$$

wherein, in Formula 1,
$A^1$ is at least one of a monovalent organic cation or a monovalent inorganic cation,
$Q^1$ is at least one of a divalent metal cation or a divalent metalloid cation, and
$X^1$ is at least one monovalent halogen ion.

14. The light-emitting device of claim 1, wherein the perovskite structure has a polycrystalline structure.

15. The light-emitting device of claim 1, wherein the emission layer comprises a first emission layer comprising a three-dimensional perovskite structure and a second emission layer comprising a two-dimensional perovskite structure.

16. The light-emitting device of claim 1, wherein
the emission layer further comprises an organic ligand,
the perovskite structure is a nanocrystal perovskite having a nanocrystal structure, and
the organic ligand surrounds at least one surface of the nanocrystal perovskite.

17. The light-emitting device of claim 1, wherein
the emission layer further comprises a polymer, and
the polymer comprises at least one of polyalkyleneoxide or polyimide.

18. The light-emitting device of claim 1, wherein the light-emitting device further comprises a hole transport region located between the first electrode and the emission layer and/or an electron transport region located between the emission layer and the second electrode.

19. The light-emitting device of claim 1, wherein the light-emitting device further comprises a charge control layer located between the first electrode and the emission layer and/or between the emission layer and the second electrode.

20. A method of manufacturing a light-emitting device, the method comprising:
providing an activation layer on a first electrode, the activation layer comprising an emission layer and an auxiliary layer; and
providing a second electrode on the activation layer, the second electrode facing the first electrode,
wherein the providing of the activation layer comprises providing the auxiliary layer on the first electrode; and providing the emission layer on the auxiliary layer,
wherein the auxiliary layer comprises a block copolymer,
the block copolymer comprises at least one hydrophilic block and at least one hydrophobic block, and
the emission layer comprises a perovskite structure.

* * * * *